(12) United States Patent
Shiina

(10) Patent No.: US 6,888,378 B2
(45) Date of Patent: May 3, 2005

(54) SEMICONDUCTOR INTEGRATED CIRCUIT

(75) Inventor: Masahiro Shiina, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 60 days.

(21) Appl. No.: 10/278,091

(22) Filed: Oct. 23, 2002

(65) Prior Publication Data

US 2003/0075771 A1 Apr. 24, 2003

(30) Foreign Application Priority Data

Oct. 24, 2001 (JP) .......................................... 2001-326367
Jan. 23, 2002 (JP) .......................................... 2002-014087

(51) Int. Cl.[7] .............................................. H03K 19/20
(52) U.S. Cl. ...................................... 326/126; 326/124
(58) Field of Search ................................. 326/124–127

(56) References Cited

U.S. PATENT DOCUMENTS

| | | | | |
|---|---|---|---|---|
| 4,626,709 A | * | 12/1986 | Mazumder et al. | 326/126 |
| 4,806,796 A | * | 2/1989 | Bushey et al. | 326/126 |
| 5,192,880 A | * | 3/1993 | Dazai | 326/126 |
| 5,331,225 A | * | 7/1994 | Matsui et al. | 326/110 |
| 5,789,946 A | * | 8/1998 | Sawairi | 326/126 |
| 6,069,523 A | * | 5/2000 | Brown | 327/563 |
| 6,690,207 B1 | * | 2/2004 | Smetana | 326/126 |

FOREIGN PATENT DOCUMENTS

| | | |
|---|---|---|
| CN | 85 1 06483 A | 3/1987 |
| JP | hei 7-307625 | 11/1995 |
| KR | 2000-0009114 | 7/1998 |
| KR | 2001-0020833 | 5/2000 |

OTHER PUBLICATIONS

Neil H. E. Weste, et al., "Principles of CMOS VLSI Design: A Systems Perspective," Addison–Wesley Publishing Company: Taiwan, Republic of China, 1984, pp. 349–351.

* cited by examiner

*Primary Examiner*—Don Le
(74) *Attorney, Agent, or Firm*—Morrison & Foerster LLP

(57) ABSTRACT

This invention prevents a cross talk caused by intersection of interconnections, and offers a semiconductor integrated circuit with improved circuit characteristics. By disposing a pair of emitter follower circuits symmetrically with respect to a center line of a differential amplifier, an area where the interconnections cross with each other is eliminated and interconnections within a circuit block and a ground wiring can be made with a single metal layer. Herewith cross talk due to the intersection of the interconnections can be resolved.

6 Claims, 6 Drawing Sheets

SEMICONDUCTOR INTEGRATED CIRCUIT

BACKGROUND OF THE INVENTION

1. Field of the Invention

This invention relates to a semiconductor integrated circuit, specifically to a technology for structuring a circuit to improve characteristics of the circuit by securing symmetry of design.

2. Description of the Related Art

A prior art semiconductor integrated circuit structure will be explained referring to FIGS. 6A and 6B hereinafter. The explanation will be given by taking a differential amplifier, which is frequently used in bipolar linear integrated circuits, as an example.

In the basic structure of the differential amplifier, both emitters of a first transistor Q11 and a second transistor Q12 are connected to a constant current transistor Q13, and each of the collectors of the transistors Q11 and Q12 is connected to a power supply Vcc through load resistors R11 and R12, respectively, as shown in FIG. 6A.

Compensating variable factors of the transistors to suppress their effects on an output is made possible by amplifying the difference between signals Vin1 and Vin2, which are respectively applied to bases of the transistors Q11 and Q12, the bases serving as input terminals, and creating output signals Vout1 and Vout2 from collectors of the transistors Q11 and Q12, respectively.

Attention is paid to secure pair matching of the transistors Q11 and Q12 as well as pair matching of the load resistors R11 and R12, since a midpoint potential of the output would shift, resulting in a loss of desired circuit characteristics, if balance between elements is lost. Here, pair matching means uniformity in the characteristics of the elements forming the pair.

However, even though attention is paid to secure the pair matching of the transistors Q11 and Q12, as well as pair matching of the load resistors R11 and R12 in the above mentioned circuit, there are problems, which are described below, when the circuit is laid out to dispose each of the semiconductor elements according to a circuit diagram, for instance from left to right (or from right to left).

That is, each of the emitter follower circuits 42 and 43 connected to each pair of the differential outputs of the differential amplifier 11 is disposed to one side (right side) of a center line of the differential amplifier 11, as shown in FIG. 6A. The emitter follower circuit 42 includes a transistor Q14, a constant current transistor Q16 and an emitter resistor R13 of the constant current transistor Q16. The emitter follower circuit 43 includes a transistor Q15, a constant current transistor Q17 and an emitter resistor R14 of the constant current transistor Q17.

Therefore, pair matching the semiconductor integrated circuit which includes the differential amplifier 11 could be lost, and an impedance offset could arise when the circuit blocks are interconnected, resulting in deterioration in the circuit characteristics.

Furthermore, interconnections 12 and 14 need to be formed with a layer which is different from the layer used for interconnections 13 and 15 (the interconnections 13 and 15 are formed with the first layer interconnection while the interconnections 12 and 14 are formed with the second layer interconnection in the above configuration), since the interconnection 12, inputting the output from the collector of the transistor Q11 to a base of the transistor Q14 of the emitter follower circuit 42, intersects with the interconnection 13 connecting the resistor R12 and the collector of the transistor Q12. Similarly, the interconnection 14, inputting the output from the collector of the transistor Q12 to a base of the transistor Q15 of the emitter follower circuit 43 intersects with the interconnection 15 connecting the emitter of the transistor Q14 and the collector of the transistor Q16 of the emitter follower 42, as shown in FIG. 6B, because both the emitter followers 42 and 43 connected with the outputs of the differential amplifier 11 are disposed to one side (right side) of a center of the differential amplifier 11, as described above. High frequency characteristics are deteriorated due to signal cross talk when the interconnections intersect with each other. In addition, the pair matching is lost because the length of the interconnection 12 differs from that of the interconnection 14. Therefore, when the circuit blocks are interconnected, desired characteristics might not be obtained because of the offset due to the impedance.

SUMMARY OF THE INVENTION

This invention is directed to solve the problems addressed above, by disposing a plurality of semiconductor elements symmetrically with respect to a center line of a circuit block that includes the plurality of semiconductor elements. The structure described above can eliminate an area where interconnections cross with each other to obtain better circuit characteristics free from cross talk.

DETAILED DESCRIPTION OF THE INVENTION

An embodiment of a semiconductor integrated circuit of this invention will be explained referring to the figures.

The explanation will be given by taking a differential amplifier, which is frequently used in bipolar linear integrated circuit, as an example.

Figure 1:
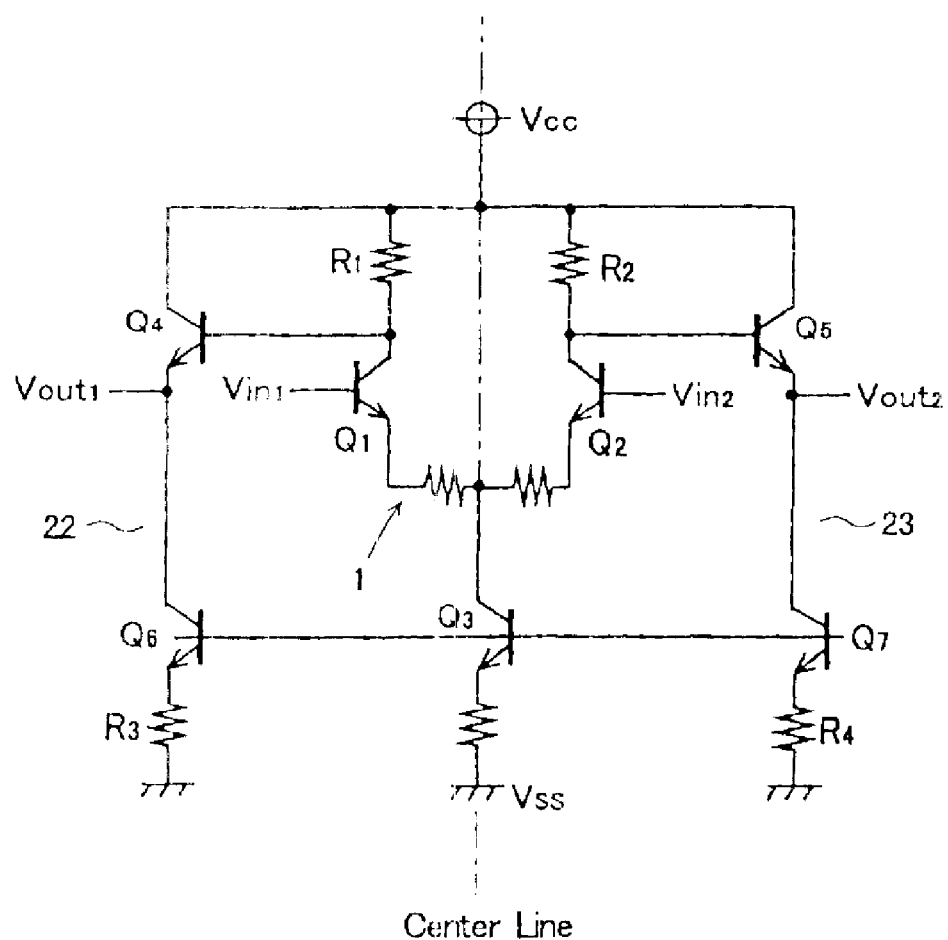
FIG. 1 shows a circuit diagram of a semiconductor integrated circuit according to a first embodiment of the invention.
Figure 2:
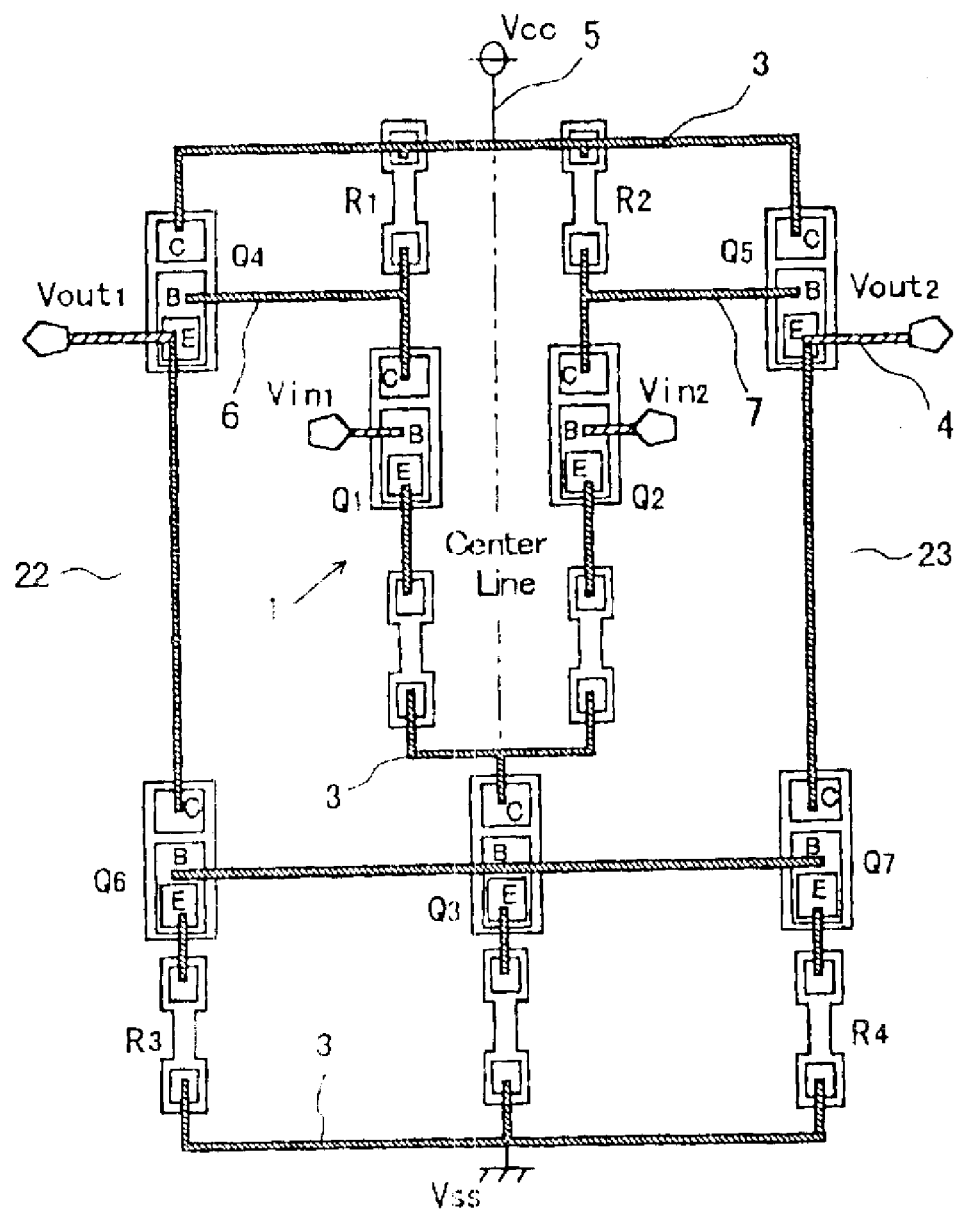
FIG. 2 shows a layout of the semiconductor integrated circuit according to the first embodiment of the invention.

As shown in FIG. 1, each of a pair of emitter follower circuits 22 and 23 is connected respectively to each of a pair of differential output terminals of a circuit block 1 (a differential amplifier in this embodiment) composed of bipolar transistors. The emitter follower circuits 22 and 23 are disposed symmetrically with respect to a center line of the circuit block 1.

Figure 6A:
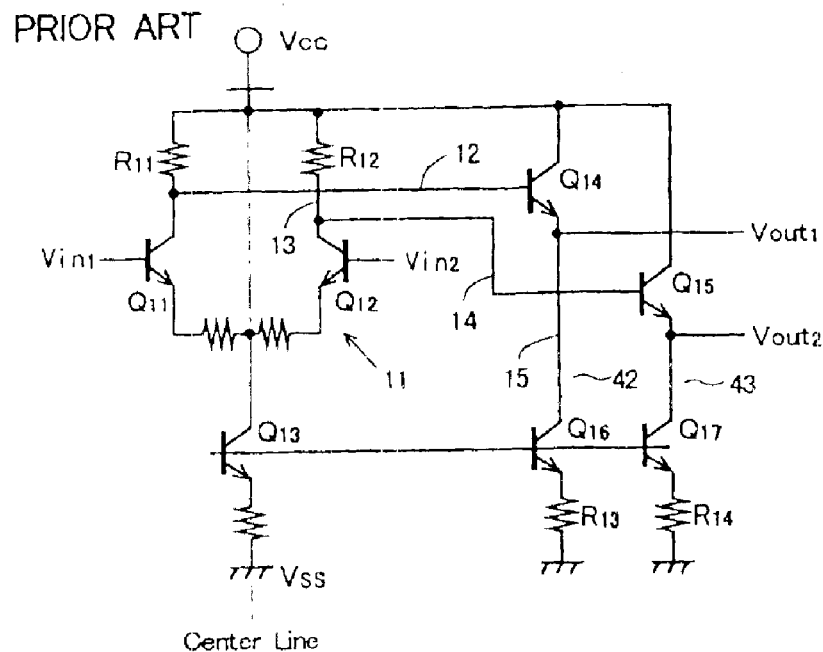
FIG. 6A shows a circuit diagram of a semiconductor integrated circuit according to the prior art.
Figure 6B:
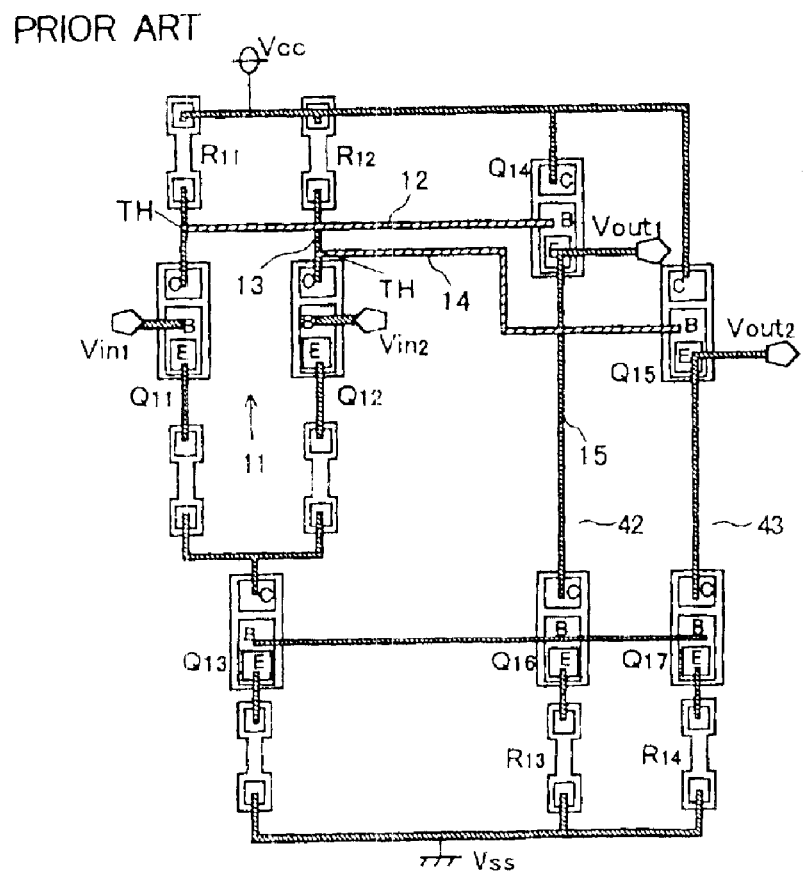
FIG. 6B shows a layout of the semiconductor circuit of the semiconductor circuit according to the prior art.

Circuit pair matching is improved herewith compared to the conventional circuit shown in FIG. 6B, in which the emitter follower circuits 42 and 43 connected with a pair of the outputs of the differential amplifier 11 are disposed asymmetrically with respect to the center line of the differential amplifier 11. Therefore, the characteristics of a semiconductor integrated circuit can be improved, when the invention is applied to a circuit such as the differential amplifier that prefers pair matching. The invention can be applied to a circuit other than the differential amplifier such as a filter. It can be applied to a semiconductor integrated circuit in which each of a pair of emitter follower circuits is connected to each of a pair of outputs of the circuit, respectively.

In the differential amplifier 1, both emitters of a first transistor Q1 and a second transistor Q2 are connected to a constant current transistor Q3, and each of collectors of the transistors Q1 and Q2 is connected to a power supply Vcc through load resisters R1 and R2, respectively, as shown in FIG. 1.

Compensating variable factors of the transistors to suppress their effects is made possible by amplifying the difference between signals Vin1 and Vin2 applied to bases of the transistors Q1 and Q2, which are input terminals, and getting output signals Vout1 and Vout2 from the collectors of the transistors Q1 and Q2.

The emitter follower circuits 22 and 23 are connected to outputs of the differential amplifier 1 and are disposed symmetrically with respect to the center line of the differential amplifier 1. Here, the emitter follower circuit 22 includes a transistor Q4, a base of which is connected to the collector of the transistor Q1, a constant current transistor Q6, which provides the transistor Q4 with constant current, and an emitter resistor R3 of the constant current transistor Q6. Similarly, the emitter follower circuit 23 includes a transistor Q5, a base of which is connected to the collector of the transistor Q2, a constant current transistor Q7, which provides the transistor Q5 with constant current, and an emitter resistor R4 of the constant current transistor Q7.

According to this embodiment, a pair of the emitter followers 22 and 23 is disposed symmetrically with respect to the center line of the differential amplifier 1. Thus, interconnections within a circuit block and a ground wiring can be made with a first metal layer 3, since the area in which the interconnections cross is eliminated.

Herewith, cross talk due to intersection of the interconnections can be resolved. Also, the interconnections 6 and 7 between the differential amplifier and the emitter follower circuits can be made equal in length. It is possible to assign a second metal layer 4 to interconnection between the circuit blocks and a third metal layer 5 to the power supply Vcc. Characteristics of the semiconductor integrated circuit with a hierarchical structure can be improved with this layout method.

Next, a second embodiment of this invention will be explained referring to the figures hereinafter.

In the second embodiment, the invention is applied to a double differential amplifier or so-called Gilbert cell.

Figure 3:
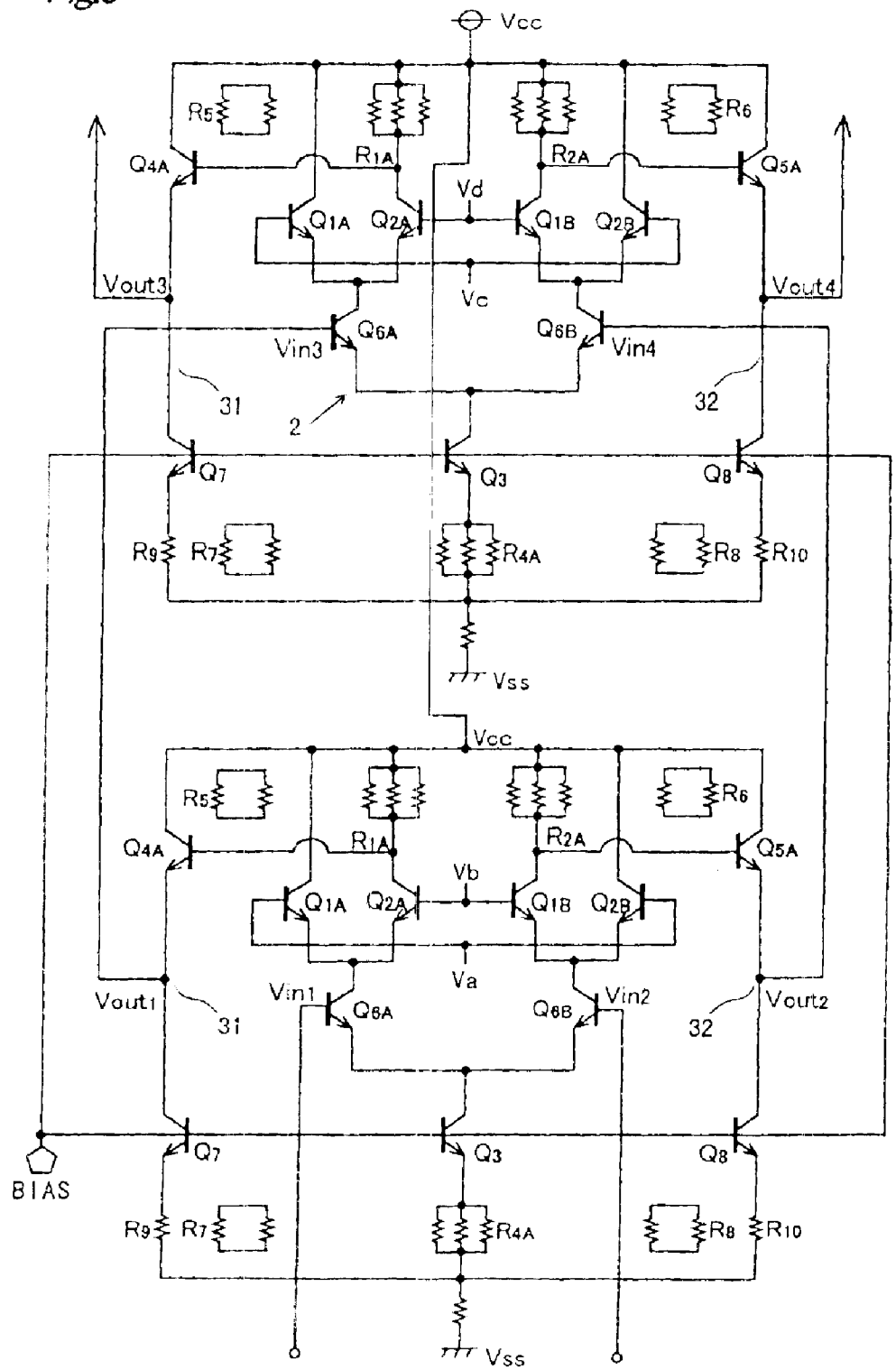
FIG. 3 shows a circuit diagram of a semiconductor integrated circuit according to a second embodiment of the invention.
Figure 4:
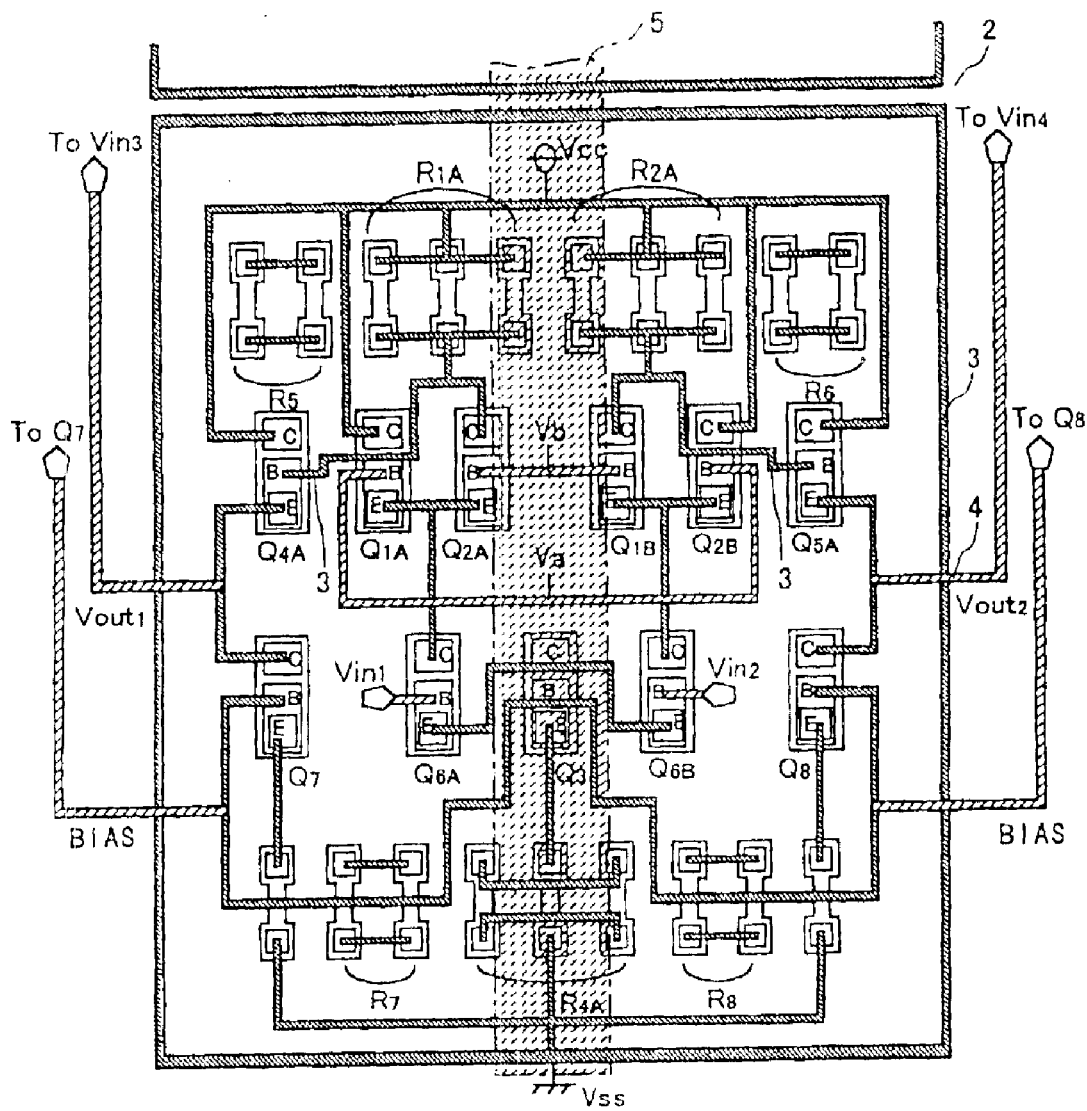
FIG. 4 shows a layout of the semiconductor integrated circuit according to the second embodiment of the invention.

FIG. 3 and FIG. 4 are a circuit diagram and a layout of a two-stage double differential amplifier 2, respectively, according to this embodiment. As shown in FIG. 3, output signals (Vout1 and Vout2) of a first-stage double differential amplifier 2 provide inputs (Vin3 applied to a base of an input transistor Q6A and Vin4 applied to a base of an input transistor Q6B) to a second stage double differential amplifier 2. This arrangement forms a sequentially connected two-stage double differential amplifier, which provides output signals Vout3 and Vout4 from the second stage double differential amplifier 2. The same symbol is attached to an equivalent component in the other stage, to avoid duplicate explanations.

As shown in FIG. 3, both emitters of a first transistor Q1A and a second transistor Q2A are connected to a collector of an input transistor Q6A, both emitters of a third transistor Q1B and a fourth transistor Q2B are connected to a collector of an input transistor Q6B, both emitters of the input transistors Q6A and Q6B are connected to a constant current transistor Q3 and each of collectors of the transistors Q2A and Q1B is connected to the power supply Vcc through each of load resistors R1A and R2A, respectively, forming a basic structure. Each of the collectors of the transistors Q1A, Q2A, Q1B and Q2B can be connected to the power supply Vcc through a load resistor instead.

Compensating variable factors of the transistors to suppress their effects is made possible by amplifying the difference between signals applied to bases of the transistors Q6A and Q6B, which are input signals Vin1 and Vin2, respectively, and obtaining the output signals Vout1 and Vout2 from the collectors of the transistors Q2A and Q1B through transistors Q4A and Q5A, respectively.

In the semiconductor integrated circuit of this embodiment, a pair of emitter follower circuits 31 and 32, each connected to a pair of outputs of the differential amplifier 2, respectively, is disposed symmetrically with respect to a center line (not shown) of the double differential amplifier 2. Here, the emitter follower circuit 31 includes the transistor Q4A, a base of which is connected to the collector of the transistor Q2A, a constant current transistor Q7, which provides the transistor Q4A with constant current, and an emitter resistor R9 of the constant current transistor Q7. Similarly, the emitter follower circuit 32 includes the transistor Q5A, a base of which is connected to the collector of the transistor Q1B, a constant current transistor Q8, which provides the transistor Q5A with constant current, and an emitter resistor R10 of the constant current transistor Q8.

When the invention is applied to a circuit such as the double differential amplifier 2 which prefers pair matching, the characteristics of the circuit can be improved, since the pair matching of the circuit is improved by disposing each pair of emitter follower circuits 31 and 32, connected to each of a plurality of the output stages, symmetrically with respect to the center line of the double differential amplifier 2.

Resistors R5, R6, R7 and R8, which are for trimming, are also disposed symmetrically with respect to the center line of the differential amplifier 2. When these resistors are used, the pair matching, and thus the characteristics of the circuit, can be maintained.

With this invention as described above, a pair of emitter follower circuits 31 and 32 is disposed symmetrically with respect to the center line of the double differential amplifier 2. Thus, interconnection within each circuit block can be made using a first metal layer 3, as shown in FIG. 4. It is possible to assign a second metal layer 4 to the interconnection between the circuit blocks and a third metal layer 5 to the power supply Vcc. Characteristics of the semiconductor integrated circuit with a hierarchical structure can be improved with this layout method.

Unlike in the prior art shown in FIGS. 6A and 6B, where the upper-layer interconnections 12 and 14 are formed above the lower-layer interconnections 13 and 15 to avoid intersecting with each other and the interconnections 12 and 14 differ in length, the circuit blocks are disposed symmetrically and the interconnections are made with a single layer (first metal layer 3) in both the first and the second embodiments, leading to improved characteristics of the semiconductor integrated circuits.

However, this invention is not limited to the single-layer interconnection mentioned above, but also applies to a structure where both an upper-layer interconnection and a lower-layer interconnection are used effectively as described below.

Figure 5:
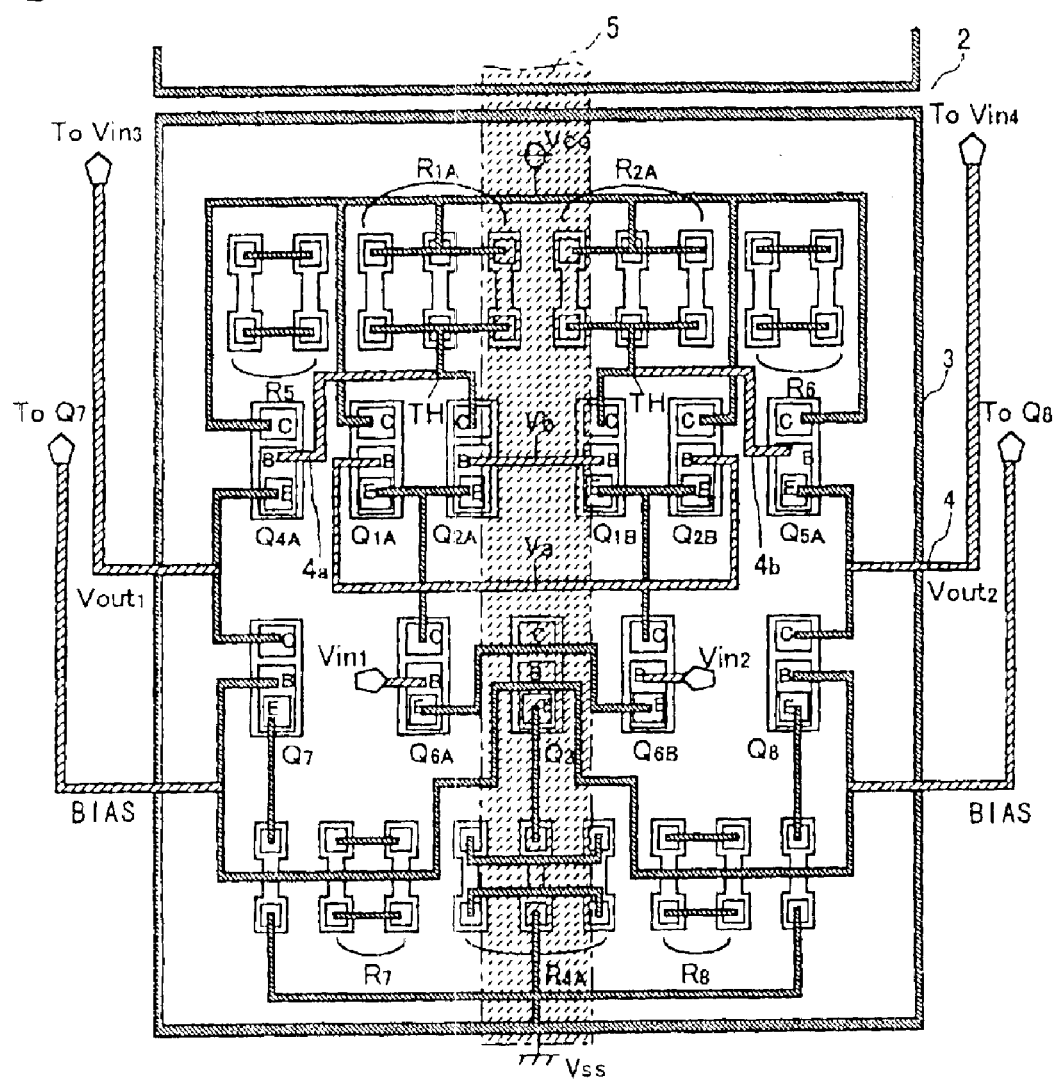
FIG. 5 shows a layout of a semiconductor integrated circuit according to a third embodiment of the invention.

The layout of a Gilbert cell shown in FIG. 5 differs from the layout of the Gilbert cell shown in FIG. 4 in that the second metal layer is used for interconnections 4a and 4b, which connect each of the collectors of the transistors Q2A and Q1B with each of the bases of the transistors Q4A and Q5B, respectively.

Although the second metal layer interconnections 4a and 4b are used in the portion mentioned above (between the collectors of the transistors Q2A and Q1B and the bases of the transistors Q4A and Q5B) as shown in FIG. 5, the offset, which exists in the prior art due to the impedance difference between the interconnections, is suppressed resulting in the improved characteristics of the semiconductor integrated circuit, since the interconnections 4a and 4b which contact the lower layer interconnection (the first metal layer 3 in this embodiment) are disposed symmetrically and are equal in length.

Other embodiments of this invention include semiconductor devices which incorporate an active element such as a bipolar or MOS element, semiconductor devices having a Gilbert-cell structure and requiring symmetry, such as a mixer or an AGC circuit, semiconductor devices used in a high frequency region, semiconductor devices using a SiGe process and semiconductor devices for satellite TV, terrestrial TV and an RF LAN.

A semiconductor integrated circuit according to an embodiment of the invention having a circuit block with a plurality of semiconductor elements can eliminate an area where interconnections cross with each other and can obtain better circuit characteristics free from cross talk, since a plurality of the semiconductor elements is disposed symmetrically with respect to a center line of the circuit block.

What is claimed is:

1. A semiconductor integrated circuit, comprising:
   a pair of differential transistors;
   a pair of load resistors, each of the load resistors being connected directly between a common power source and a corresponding differential transistor; and
   a circuit block having a pair of emitter follower circuits connected respectively to a pair of differential outputs of the differential transistors,
   wherein the pair of differential transistors, the pair of the load resistors and the pair of emitter follower circuits are disposed symmetrically with respect to a center line of the circuit block.

2. The semiconductor integrated circuit of claim 1, wherein each emitter follower circuit comprises a first transistor having a base connected with a collector of one of the differential transistors and a second transistor providing the first transistor with an electric current.

3. A semiconductor integrated circuit, comprising:
   a pair of differential transistors;
   a circuit block having a pair of emitter follower circuits connected respectively to a pair of differential outputs of the differential transistors;
   a pair of wiring lines connected to the differential transistors and another pair of wiring lines connected to the emitter follower circuits, wherein
   the pair of differential transistors and the pair of emitter follower circuits are disposed symmetrically with respect to a center line of the circuit block, and
   the wiring lines connected to the differential transistors cross the corresponding wiring lines connected to the emitter follower circuits, and the wiring lines in each pair are disposed symmetrically with respect to the center line of the circuit block.

4. A semiconductor integrated circuit, comprising:
   a circuit block; and
   a pair of emitter follower circuits,
   wherein the emitter follower circuits are disposed symmetrically with respect to a center line of the circuit block and all semiconductor elements of the circuit block are disposed symmetrically with respect to the center line of the circuit block.

5. The semiconductor integrated circuit of claim 4, wherein the circuit block comprises a pair of bipolar transistors that are disposed symmetrically in the circuit block with respect to the center line.

6. The semiconductor integrated circuit of claim 4, wherein the circuit block comprises a pair of differential amplifiers that are disposed symmetrically in the circuit block with respect to the center line.

* * * * *